(12) United States Patent
Bhushan et al.

(10) Patent No.: US 7,595,654 B2
(45) Date of Patent: Sep. 29, 2009

(54) METHODS AND APPARATUS FOR INLINE VARIABILITY MEASUREMENT OF INTEGRATED CIRCUIT COMPONENTS

(75) Inventors: Manjul Bhushan, Hopewell Junction, NY (US); Karen M. G. V. Gettings, N. Chelmsford, MA (US); Wilfried E. Haensch, Somers, NY (US); Brian L. Ji, Fishkill, NY (US); Mark B. Ketchen, Hadley, MA (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 12/041,388

(22) Filed: Mar. 3, 2008

(65) Prior Publication Data

US 2008/0142848 A1   Jun. 19, 2008

Related U.S. Application Data

(62) Division of application No. 11/297,730, filed on Dec. 8, 2005, now Pat. No. 7,342,406.

(51) Int. Cl.
*G01R 31/26* (2006.01)
(52) U.S. Cl. .................... 324/765; 324/763; 324/769
(58) Field of Classification Search .............. None
See application file for complete search history.

(56) References Cited

U.S. PATENT DOCUMENTS

| 5,517,107 | A  | * | 5/1996 | Ovens et al. ............. 324/158.1 |
| 6,281,696 | B1 | * | 8/2001 | Voogel ....................... 324/765 |
| 6,503,765 | B1 |   | 1/2003 | Chao et al. |
| 6,784,685 | B2 |   | 8/2004 | Chao et al. |

OTHER PUBLICATIONS

K. Terada et al., "A Test Circuit for Measuring MOSFET Threshold Voltage Mismatch," Microelectronic Test Structures, International Conference, 2003, pp. 227-231.
K. Terada et al., "Further Study of VTH-Mismatch Evaluation Circuit," Proceedings of IEEE International Conference on Microelectronic Test Structures, Mar. 2004, pp. 155-159, vol. 17.

* cited by examiner

*Primary Examiner*—Minh N Tang
(74) *Attorney, Agent, or Firm*—Ryan, Mason & Lewis, LLP

(57) ABSTRACT

An integrated circuit device is provided including at least one first array configuration of integrated circuit components comprising a m×n array of FETs, without specified internal connections between the integrated circuit components, wherein m is greater than two. The integrated circuit device further includes at least one second array configuration of integrated circuit components comprising an array of integrated circuit components nominally identical to those of the first array configuration, with specified internal connections between integrated circuit components. A variation coefficient is determined for the integrated circuit components based on a measured specified parameter of the first array configuration and the second array configuration.

8 Claims, 10 Drawing Sheets

ARRAY WITH ACTIVE SWITCHES

ARRAY WITH ACTIVE SWITCHES

TYPE F

TYPE C 4 x 4 RESISTOR ARRAY

METHODS AND APPARATUS FOR INLINE VARIABILITY MEASUREMENT OF INTEGRATED CIRCUIT COMPONENTS

CROSS-REFERENCE TO RELATED APPLICATION(S)

This application is a divisional of pending U.S. application Ser. No. 11/297,730, filed on Dec. 8, 2005, now U.S Pat. No. 7,342,406, the disclosure of which is incorporated by reference herein.

FIELD OF THE INVENTION

The present invention relates generally to semiconductor integrated circuit devices and, more particularly, to techniques for measuring the variability of integrated circuit components in an inline test environment.

BACKGROUND OF THE INVENTION

Scaling in semiconductor technology has directly resulted in the ability to place an increased number of transistors and other integrated circuit components onto a single chip. This has lead to increased process and manufacturing capabilities. However, the relative variations, and in some cases, the absolute variations, of key parameters have also increased resulting in their greater importance due to their major role in chip functionality, yield and system optimization. Key parameters may include, for example, the resistance value of vias and the threshold voltage of transistors. In order to manage variability in semiconductor integrated circuit technology, characterizations of variability must be implemented in the manufacturing process.

Traditionally, due to the limitations of layout area and testing time, test structures containing only a few elements of the integrated circuit components such as, for example, transistors or a chain of vias, were designed and monitored. More recently, Addressable Parametric Diagnostic (APD) schemes have been utilized together with high speed testing tools. See, for example, U.S. Pat. Nos. 6,503,765 and 6,784,685. APD is a memory-array-like macro in which each cell in the array contains a test structure such as, for example, a via chain. However, questions remain as to whether the data intensive nature and high speed measurement of APD schemes are practical, and whether APD is able to be widely utilized in a manufacturing environment.

In a separate approach, a scheme has been proposed for measuring metal oxide substrate field effect transistor (MOSFET) threshold mismatch, see, for example, K. Terada et al., "A Test Circuit for Measuring MOSFET Threshold Voltage Mismatch," Microelectronic Test Structures, 2003, International Conference, March 2003, pp. 227-231; and K. Terada et al. "Further Study of V/Sub TH/-Mismatch Evaluation Circuit," Microelectronic Test Structures, 2004, Proceedings, ICMTS '04, The International Conference, March 2004, pp. 155-159. The test circuits proposed consist of many parallel connected unit cells, in which two nominally identical MOSFETs are serially-connected to each other. The node between the nominally identical MOSFETs is connected to common wiring through a switch. The threshold voltage mismatch for the two MOSFETs is derived from the DC currents flowing through this test circuit, as will be described in greater detail with respect to FIG. 9 below. However, this approach, including experimental demonstrations, was limited to unit cells of two serially-connected nominally identical MOSFETs in their sub-threshold region, and failed to address the broader area of variability measurement.

In summary, the techniques presented above that are currently used in parameter variability measurements fail to address all the requirements for technology development as well as manufacturing process monitoring and control.

SUMMARY OF THE INVENTION

The present invention provides technique for measuring the variability of integrated circuit components in an inline test environment.

For example, in one aspect of the present invention, a method of measuring variability of integrated circuit components is provided. A specified parameter of at least one first array configuration comprising a plurality of the integrated circuit components without specified internal connections between the integrated circuit components is measured. The specified parameter of at least one second array configuration comprising a plurality of the integrated circuit components nominally identical to those of the first array configuration with specified internal connections between the integrated circuit components is also measured. A variation coefficient is determined for the integrated circuit components based on the measured specified parameter of the at least one first array configuration and the at least one second array configuration.

In this embodiment of the present invention, the at least one first array configuration and the at least one second array configuration may each comprise an m×n array of at least one of resistors, capacitors and inductors. When the arrays comprise resistors, the measured specified parameter may comprise at least one of DC current and a DC voltage. When the arrays comprise capacitors or inductors, the measured specified parameter may comprise an AC impedance.

Alternatively, in this embodiment of the present invention, the at least one first array configuration and the at least one second array configuration each may comprise an m×n array of field effect transistors (FETs), wherein m is greater than two, and the measured specified parameter comprises at least one of a DC current and a DC voltage.

In a further alternative of this embodiment of the present invention, the at least one first array configuration and the at least one second array configuration may each comprise two or more unit cells connected in parallel, wherein each unit cell comprises at least one n-channel FET (nFET) and at least one p-channel FET (pFET), and the measured specified parameter comprises at least one of a DC current and a DC voltage.

In an additional embodiment of the present invention, an integrated circuit device is provided comprising at least one first array configuration of integrated circuit components comprising an m×n array of at least one of resistors, capacitors and inductors, without specified internal connections between the integrated circuit components. The integrated circuit device further comprises at least one second array configuration of integrated circuit components comprising an array of integrated circuit components nominally identical to those of the at least one first array configuration, with specified internal connections between integrated circuit components. The variation coefficient is determined for the integrated circuit components based on a measured specified parameter of the at least one first array configuration and the at least one second array configuration.

This embodiment of the present invention may also include a set of ring oscillator circuits when the at least one first array configuration of integrated circuit components comprises an m×n array of capacitors. A reference ring oscillator circuit has a plurality of stages, each stage comprising a logic gate. A second ring oscillator circuit has a plurality of stages, each stage comprising a logic gate substantially identical to the logic gates of the reference ring oscillator circuit, and a first array configuration driven by the logic gate. A measured difference in capacitance between the reference ring oscillator circuit per stage and the second ring oscillator circuit per stage comprises a gate capacitance of a second array configuration load. A third ring oscillator circuit has a plurality of stages, each stage comprising a logic gate substantially identical to the logic gates of the reference ring oscillator circuit, and a second array configuration driven by the logic gate. A measured difference in capacitance between the reference ring oscillator circuit per stage at the third ring oscillator circuit per stage comprises a gate capacitance of a third array configuration load.

Further embodiments of the present invention may provide integrated circuit devices in which the at least one first array configuration and the at least one second array configuration each may comprise: (1) at least one of a m×n array of FETs where m is greater than two; and (2) two or more unit cells connected in parallel, wherein each unit cell comprises at least one nFET and at least one pFET.

Therefore, the above discussed drawbacks and deficiencies of the traditional measurement techniques are overcome or alleviated by the structures and methodologies of the present invention. These structures can be designed easily, tested rapidly with standard in-line testers, to extract accurate statistics from a large number of elements.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

As will be illustrated in detail below, the present invention introduces techniques for measuring specified parameters from array configurations of an integrated circuit component and techniques for measuring variability of the integrated circuit component inline based on the specified parameter measurements.

The coefficient of variation for a given integrated circuit component, specifically $C_v=\sigma/\mu$, where $\sigma$ is the standard deviation and $\mu$ is the mean, may be determined from measurements on integrated circuit component arrays. The embodiments of the present invention illustrate two different array configurations. A first array configuration with certain internal nodes connected, and a second without these internal nodes connected. Test macros may be implemented in two ways: a single array with active "on-off" switches for internal connections, see, for example FIGS. 1 and 2; and two separate arrays that are nominally identical except for some internal connections which are permanently made in one array, see, for example, FIG. 3.

Figure 1:
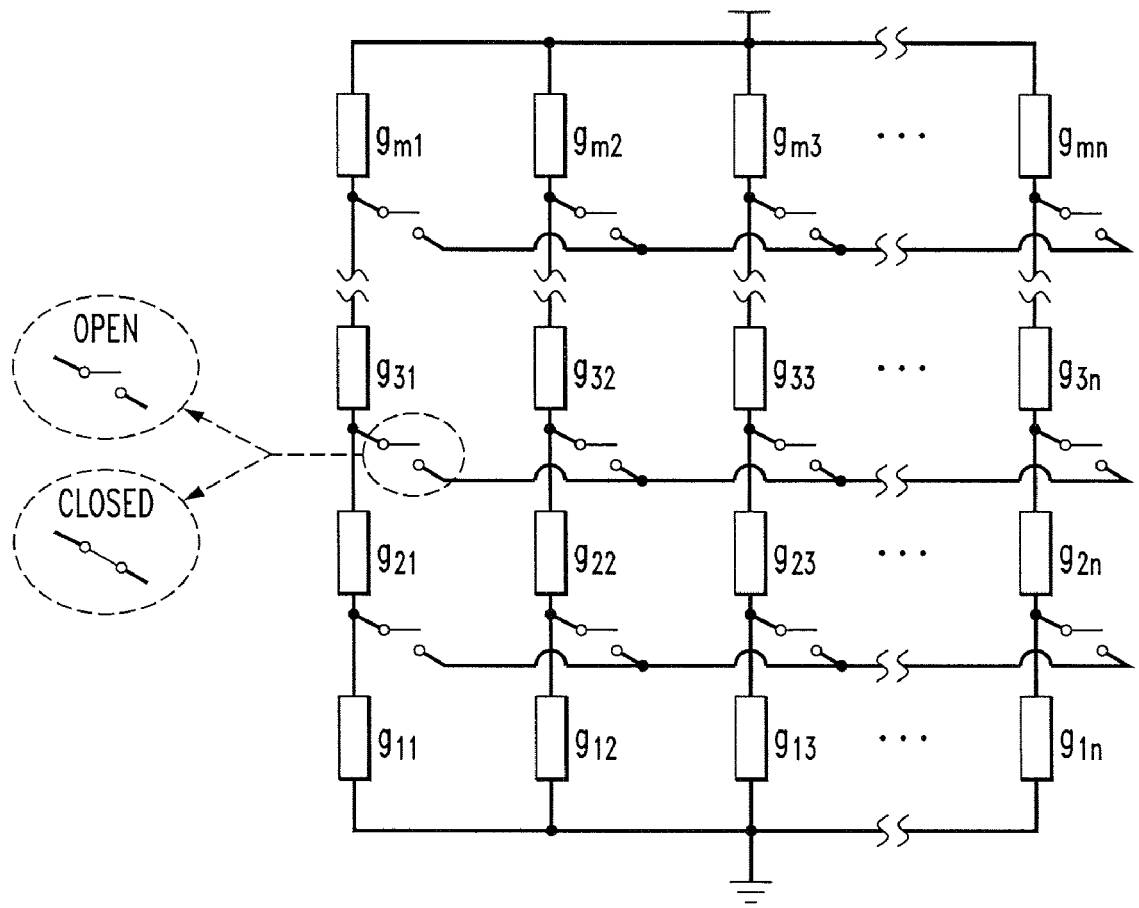
FIG. 1 is a diagram illustrating a first embodiment of an m×n array of integrated circuit components having inner node connections controlled by active switches, according to an embodiment of the present invention.

Referring initially to FIG. 1, a diagram illustrates a first embodiment of an array of integrated circuit components having horizontal inner node connections controlled by active switches, according to an embodiment of the present invention. In this embodiment, m×n conductors are formed as a rectangular lattice, where m denotes the number of rows and n denotes the number of columns, and with the active switches having "open" and "closed" states. When the switches are "open," the inner nodes are not connected horizontally, which is also referred to as a type F or "floating" topology. When the switches are "closed," the inner nodes are connected horizontally, which is also referred to as a type C or a "connected" topology.

Figure 2:
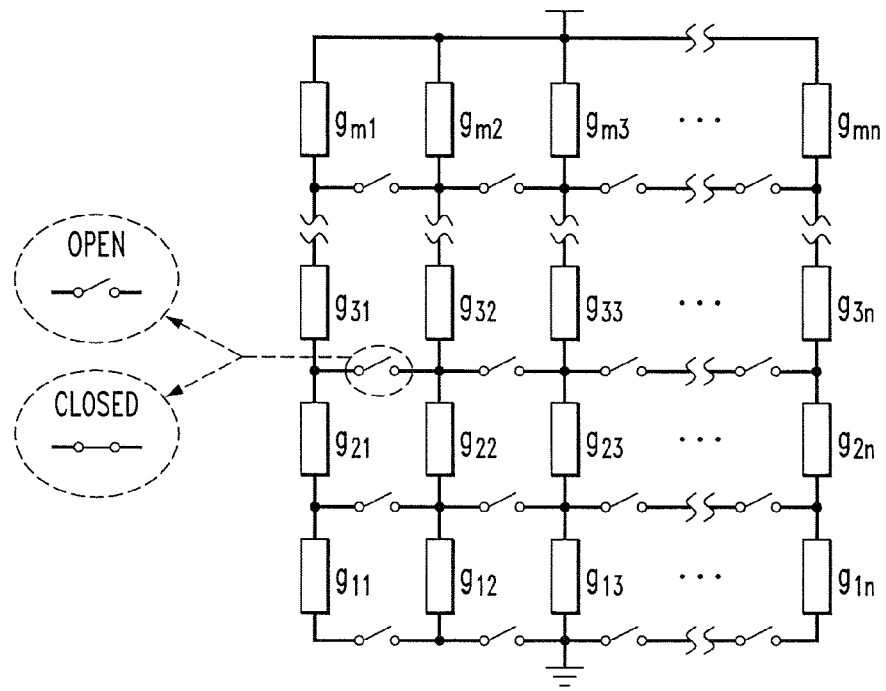
FIG. 2 is a diagram illustrating a second embodiment of an m×n array of integrated circuit components having inner node connections controlled by active switches, according to an embodiment of the present invention.

FIG. 2 illustrates a second embodiment of an m×n array of integrated circuit components having horizontal inner node connections controlled by active switches, according to an embodiment of the present invention. As shown in FIGS. 1 and 2, switches can be implemented in different ways. FIG. 1 illustrates switches between every element and a common wire. FIG. 2 illustrates switches between every two neighboring elements. In the embodiment of FIG. 1, the total resistance between column i and column j, $R_{i,j}=2*Rswitch+(j-i)*Rwire$. On the other hand, with respect to FIG. 2, the total resistance $R_{i,j(old)}=(j-i)*(Rswitch+Rwire)$ is much larger than that of FIG. 1, if Rswitch >>Rwire and n >>1. Since Rswitch is likely to be dominant, it is expected that FIG. 1 would have lower horizontal connection resistance in general. Nevertheless, FIG. 2 may have an advantage in dense layout situations.

Figure 3:
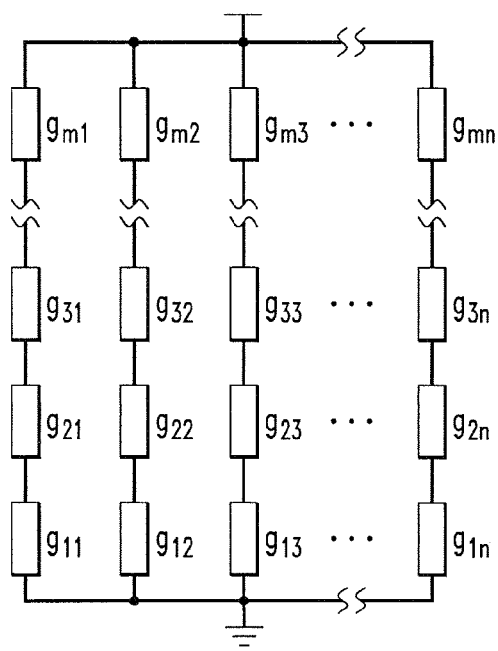
FIG. 3 is a pair of diagrams each illustrating an m×n array of integrated circuit components, one with and one without horizontal inner nodes connected, according to an embodiment of the present invention.
Figure 3:
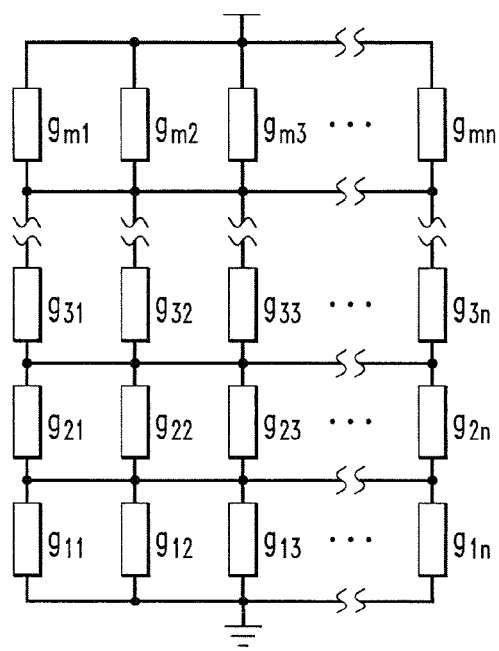

Referring now to FIG. 3, a pair of diagrams is provided, each illustrating an m×n array of integrated circuit components, one with horizontal inner node connections, and one without horizontal inner node connections, according to an embodiment of the present invention In this embodiment of the present invention, two separate arrays of m×n conductors are formed as a rectangular lattice. The inner nodes are not connected horizontally in type the F topology, but are connected horizontally in the type C topology.

As shown in FIGS. 1-3, (m, n) or "m×n" arrays are utilized, where m is the number of rows and n is the number of columns. In general, a larger array corresponds to less noise or variance in the determination of the variation coefficient for the integrated circuit component. Provided in more detail below are both Monte Carlo simulation results and quantitative models for m×n arrays.

Note that while the embodiments of the present invention describe and illustrate an exemplary conductor or resistor as the integrated circuit component to be analyzed, the structure and methodology of the present invention may easily be generalized to include other elements, such as, for example, transistors, capacitors, inductors, and anything that may be electrically connected in series and in parallel.

Let $g_{ij}$ be the conductance of the conductor at row i and column j, where i=1, 2, 3 ... m, and j=1, 2, 3 ... n. Let $G_F$ and $G_C$ be the conductance of type F and C topologies, respectively. Statistic information may be obtained from a ratio of conductance of connected and floating arrays.

$$E\left[\frac{G_C - G_F}{G_C}\right] \approx f(\sigma/\mu) \quad (1)$$

Here "$f$" is used to denote a general functional relationship to the statistical properties of the components (i.e., the conductor $g_{ij}$ in the above example) in terms of its mean $\mu$ and its standard deviation $\sigma$. Also, throughout this disclosure, "E[ ]" is used to denote the expected value in statistics.

More specifically, if $g_{ij}$ follows the identical and independent statistical distribution $F(\mu, \sigma)$, where $\mu$ is the mean, $\sigma$ is the standard deviation, and $\sigma/\mu<1$, for any m and n, $$E\left[\frac{G_C - G_F}{G_C}\right] \approx \frac{(m-1)\cdot(n-1)\cdot\sigma^2}{m\cdot n\cdot\mu^2} \quad (2)$$

Figure 4:
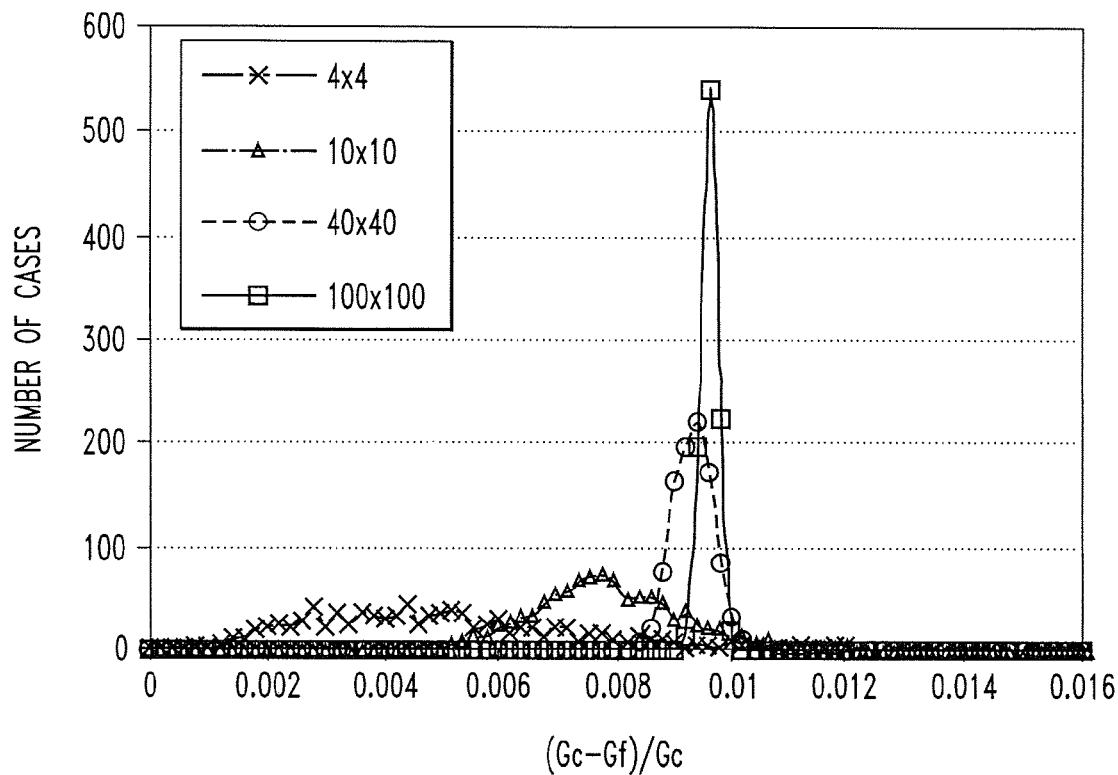
FIG. 4 is a histogram illustrating 1000-case Monte Carlo simulation results of an n×n array of integrated circuit components having inner node connections controlled by active switches for a series of values of n, according to an embodiment of the present invention.

Referring now to FIG. 4, simulation results are shown of an n×n array of integrated circuit components having inner node connections controlled by active switches, according to an embodiment of the present invention. This embodiment of the present invention illustrates Monte Carlo simulation results, which show that as n increases, the conductance ratio approaches a constant non-zero value, as indicated by Equation (2) and as shown in FIG. 4. The conductors have a normal distribution with $\sigma/\mu=10\%$. This simulation is run with n=4, 10, 40, 100.

Figure 5:
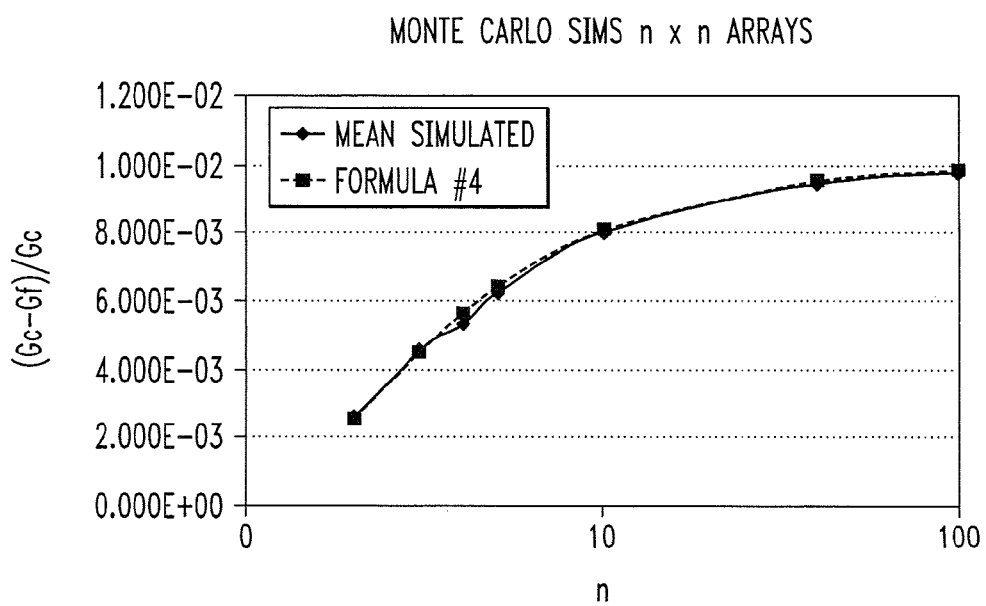
FIG. 5 is graph illustrating expected values of $(G_C-G_F)/G_C$ in relation to n for an n×n array of integrated circuit components, according to an embodiment of the present invention.

Referring now to FIG. 5, a graph illustrates the expected values of the conductance ratio, $(G_C-G_F)/G_C$, in relation to n, for an n×n array of integrated circuit components, according to an embodiment of the present invention. The expected values of $(G_C-G_F)/G_C$ are calculated from 1000 case Monte Carlo simulations for n×n arrays of conductors having a normal distribution with $\sigma/\mu=10\%$. This graph is also fitted with Equation (2).

Equation (2) has the following special cases.

For 2×n arrays, and for n>>1, $$\frac{E[G_C] - E[G_F]}{E[G_C]} = \frac{\sigma^2}{2\cdot\mu^2} \quad (3a)$$

For m×n arrays, and for n>>1, $$\frac{E[G_C] - E[G_F]}{E[G_C]} = \frac{(m-1)\cdot\sigma^2}{m\cdot\mu^2} \quad (3b)$$

Figure 6:
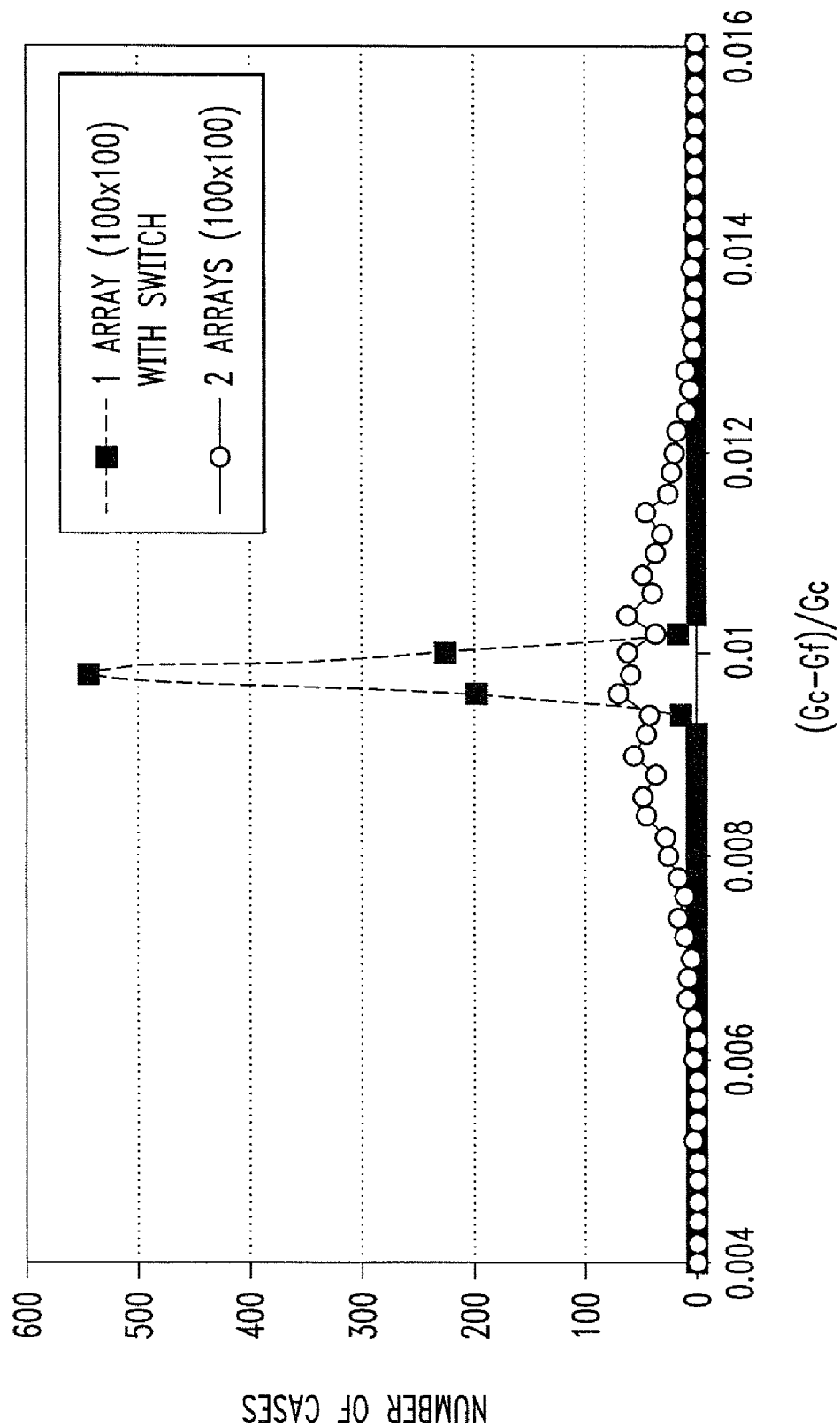
FIG. 6 is a histogram illustrating 1000-case Monte Carlo simulation results of 100×100 arrays of integrated circuit components, using one array with inner nodes controlled by active switches, and using two separate arrays with and without horizontal inner nodes connected, according to an embodiment of the present invention.

Although the expected values obtained from two different arrays (C versus F) or from the same array with active switches will approach the same value, their noise levels are quite different. Referring now to FIG. 6, simulation results are shown for 100×100 arrays of integrated circuit components having inner node connections controlled by active switches, with horizontal inner nodes connected and without horizontal inner nodes connected, according to an embodiment of the present invention. This histogram was constructed through Monte Carlo results. Although the two results have the expected value, more specifically, the same mean, the variance resulting from the array with switches is considerably smaller than the variance resulting from the two separate arrays, with and without horizontal inner node connections.

As is evident from FIG. 6, the variances of the estimated variation coefficient using one array with switches is significantly smaller than that using two different arrays. Therefore, a more quantitative analysis is required to form a basis for properly designed test macros where the signal is reasonably larger than the variance.

It is also important to address the measurement of variation statistics on m×n arrays for two cases. In the first case, the two measurements are done on the same array having inner node connections controlled by active switches. Let $G_{F1}$ and $G_{C1}$ be the conductance for the type F and C for the same array denoted as array 1. In the second case, the two measurements are done on two different arrays, one with and one without horizontal inner nodes connected. Let $G_{C1}$ be the conductance for a type C array denoted as array 1 and $G_{F2}$ be the conductance for a separate type F array denoted as array 2.

$$E\left[\frac{G_{C1} - G_{F2}}{G_{C1}}\right] \approx E\left[\frac{G_{C1} - G_{F1}}{G_{C1}}\right] \approx \frac{(m-1)\cdot(n-1)\cdot\sigma^2}{m\cdot n\cdot\mu^2} \quad (4)$$

$$VAR\left[\frac{G_{C1} - G_{F1}}{G_{C1}}\right] \approx \frac{(m-1)\cdot(n-1)}{m\cdot n}\cdot\frac{2\cdot(m\cdot n-1)\cdot\sigma^4}{(m\cdot n)^2\cdot\mu^4} \quad (5)$$

$$VAR\left[\frac{G_{C1} - G_{F2}}{G_{C1}}\right] \approx \frac{2\cdot\sigma^2}{m\cdot n\cdot\mu^2} \quad (6)$$

For m>>1, n>>1 and N=m×n, then the expected value and standard deviation are, $$E\left[\frac{G_{C1} - G_{F2}}{G_{C1}}\right] = E\left[\frac{G_{C1} - G_{F1}}{G_{C1}}\right] = \frac{E[G_C] - E[G_F]}{E[G_C]} \approx \frac{\sigma^2}{\mu^2} \quad (4b)$$

$$stdDev\left[\frac{G_{C1} - G_{F1}}{G_{C1}}\right] \approx \sqrt{\frac{2}{N}} \cdot \frac{\sigma^2}{\mu^2} \quad (5b)$$

$$stdDev\left[\frac{G_{C1} - G_{F2}}{G_{C1}}\right] \approx \sqrt{\frac{2}{N}} \cdot \frac{\sigma}{N} \quad (6b)$$

Figure 7:
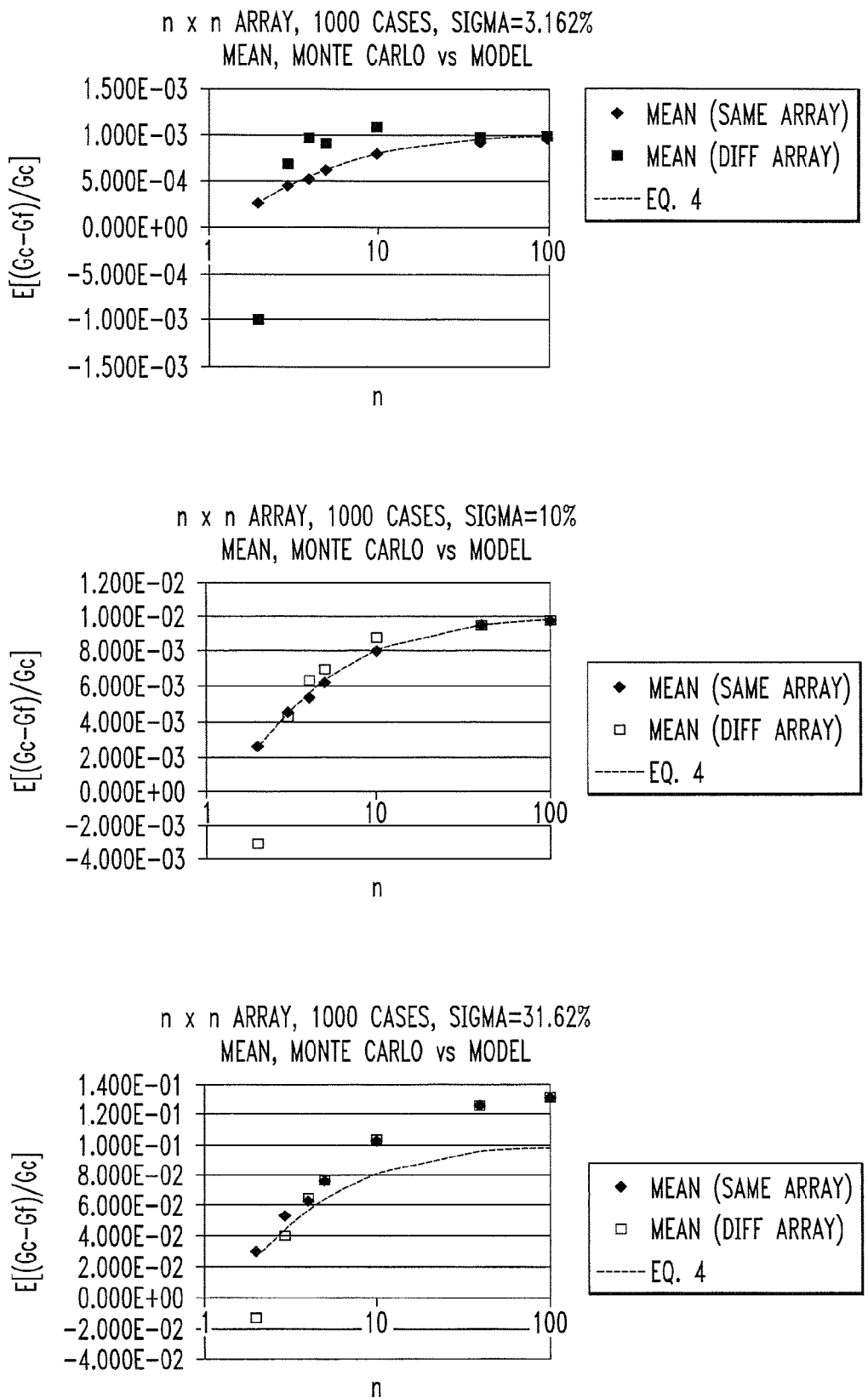
FIG. 7 is a series of graphs illustrating mean and variance of $(G_C-G_F)/G_C$ for an n×n array with varying values of $\sigma/\mu$, according to an embodiment of the present invention.
Figure 7:
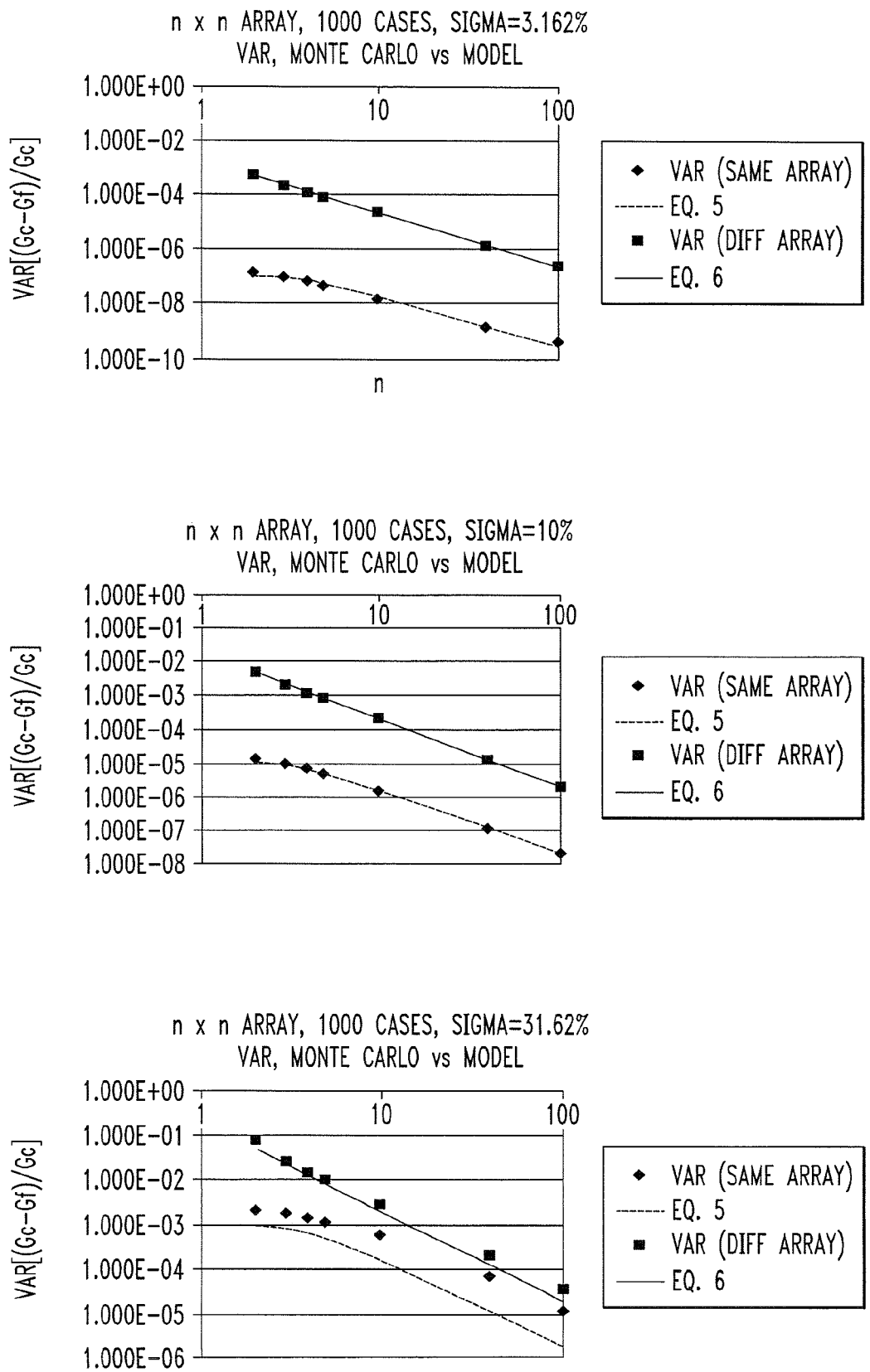

Referring now to FIG. 7, a series of graphs illustrate mean and variance of $(G_C-G_F)/G_C$ for an n×n array with varying values of $\sigma/\mu$, according to an embodiment of the present invention. These graphs are the result of Monte Carlo simulations for n×n arrays of conductors having a normal distribution with $\sigma/\mu=3.162\%$ and 10%, respectively. Results from a single array with switches are plotted against results of two separate arrays.

The simulated results are fitted well to Equations (4)-(6) for small $\sigma/\mu$, and for small deviation such as $\sigma/\mu=3\%$ and 10%. When the $\sigma/\mu$ is larger than 30%, the expected value of $(G_C-G_F)/G_C$ becomes larger than that predicted by Equation (4). Similar for larger $\sigma/\mu$, while the variance from different arrays continues to fit Equation (5), the variance from the same array becomes much larger than that predicted by Equation (6).

In order to achieve a proper design, it is important to calculate the variance of statistics obtained from a particular test structure and ensure that it is reasonably smaller than the signal itself. From the above discussion, it may appear that it is always better to design a single array test structure with active switches. However, it has been assumed ideal zero resistance switches may be implemented, which may or may not be the case in practice. Therefore, if one can implement the horizontal wiring and active switches with total resistance being negligible when compared to resistance of the test element, a single array is preferred. If the switch cannot be implemented with negligible resistance, two different hard-wired arrays (C versus F) are used and more care is taken with the larger variance. Equations (5) and (6) provide some quantitative guidance on the variance trend.

Comparing Equations (5b) and (6b), it is observed that the standard deviation of $(G_C-G_F)/G_C$ from one array with switches is smaller than that of two different arrays by a factor of $\sigma/\mu$. The standard deviation is also proportional to the square root of N=m×n. Thus, for an equivalent standard deviation as the single array with switches, the number of elements in the 2-array scheme has to be larger by a factor of 100, 1000 and 10000, for $\sigma/\mu=10\%$, 3.162% and 1%, respectively. The difference between the two schemes decreases as $\sigma/\mu$ increases.

Thus far it has been assumed that the horizontal wiring in FIGS. 1-3 has had negligible resistance. However, the situation in which the wiring resistance becomes comparable to the resistance of test elements should also be addressed. Qualitatively, if the horizontal wiring resistance in a horizontally connected array (type C in FIG. 3) is infinitely large, then this array is the same as a floating array (type F in FIG. 3). Therefore, one would expect as the horizontal wiring and switch resistance increases, the conductance difference between the type F and type C structure goes from the value predicted in Equations (2) or (4) to zero.

Figure 8:
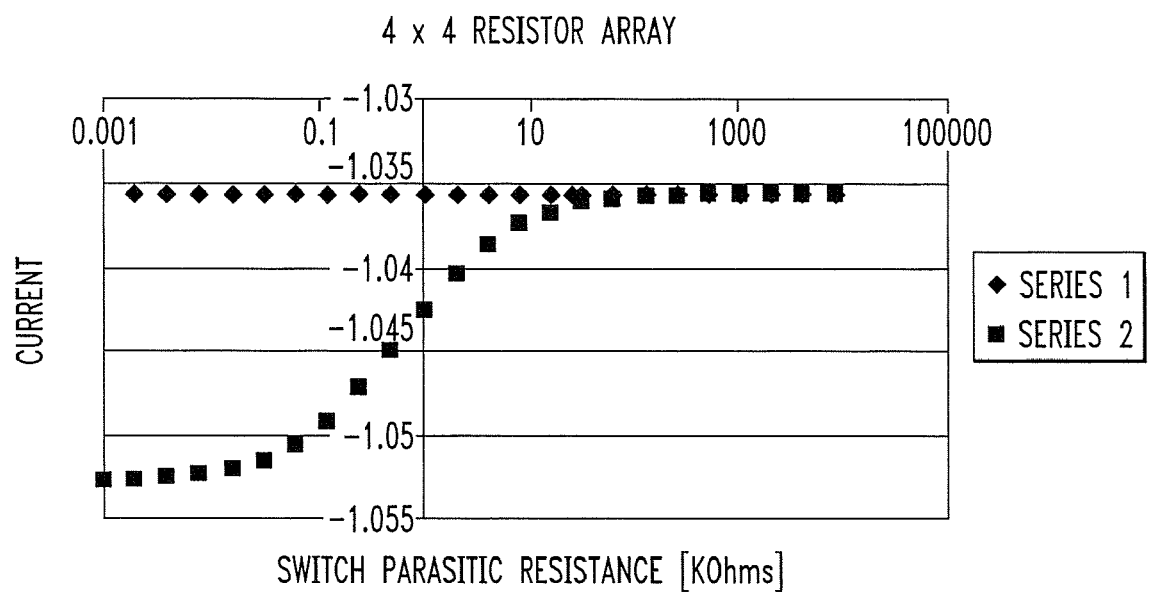
FIG. 8 is a graph illustrating average values of current for 4×4 arrays, according to an embodiment of the present invention.

Referring now to FIG. 8, a graph illustrates average values of current through 4×4 arrays, according to an embodiment of the present invention. Results are shown for the type C and type F structures implemented with active switches. The results of 4×4 arrays shows a transitional area from the point where the switch resistance is 10 times smaller than the resistance of the integrated circuit component, where the difference is close to that of perfect switches (i.e., negligible resistance), to the point where the switch resistance is 10 times larger, where the difference is approaching zero. Average values of $I_C$, the current through a type C array, and $I_F$, the current through a type F array, for 100-case Monte Carlo simulations for 4×4 arrays are provided in FIG. 8, where the nominal element resistance is 1 kOhm. It is plotted as a function of switch parasitic resistance from 0.001 kOhm to 8389 kOhm.

For a much larger array, for example, 100×100, to reach the full value in Equation (4), the total resistance from the most left device to the most right device should be small when compared to that of a single resistor element. However, one can also see from Equation (4), the ratio from a 10×10 array is only slightly smaller that of a 100×100 array. Therefore, if a 100×100 array is viewed as a congregation of many 10×10 arrays, then the requirement is further relaxed.

There are many alternative wiring schemes to those shown in the type C and type F arrays of FIG. 3. For example, one array may be horizontally wired every two rows, while another array may have one horizontal connection for every four rows. Based on the above discussion and basic statistics knowledge, one can use a group of structures and extract the statistics with more confidence.

Although the discussion above provides embodiments having conductor or resistor arrays, the present invention may be extended to transistors, capacitors, inductors, etc. Moreover, the unit cell needs not to be a simple element, it could be a combination of different basic elements, for example, a unit cell of a poly resistor and 2 contacts, and/or circuit blocks, for example, driver elements, memory elements, etc.

In many practical environments, only a small array may be easily designed. The present invention is applicable even for a 2×2 array, if one can average many samples to make the variance in the measurement smaller. In general, the resolution with this technique will scale as the square root of the number of arrays.

In another embodiment of the present invention, a specific 2×n MOSFET array may be constructed which provides the benefits described above. In the Terada references described above, the test circuit consists of many parallel connected unit cells, in which two nominally identical nFETs are serially connected. The node between these two nFETs is connected to common wiring through a switch. The threshold voltage mismatch for the two nFETs is derived from the DC currents flowing through this test circuit.

Figure 9:
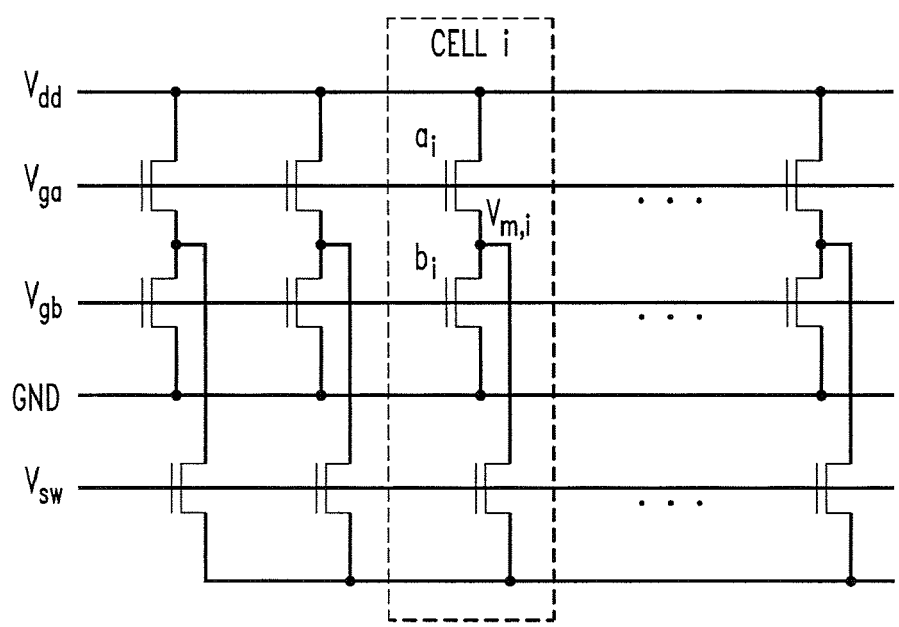
FIG. 9 is a circuit diagram illustrating a unit cell having two nominally identical nFETs, according to Terada.

Referring now to FIG. 9, a circuit diagram illustrates a unit cell having two nominally identical nFETs, a and b, according to the Terada references described above. Although devices a and b are nominally identical, their electric behaviors are not, particularly in the topologies relation to device mismatch. For the lower device, nFET b, the gate voltage is set to Vgb and the source is ground, gnd. Thus, the gate-to-source voltage is a constant. For the upper device, nFET a, the gate voltage is set to a constant Va, however, the source is at the mid-node Vm, which is a random variable dependant on the mismatch between the two devices. Therefore, the gate-to-source voltage for upper device a is a random variable. Although statistics may be extracted through extensive Monte Carlo simulations and detailed analysis, it is not clear whether and to what extent the extracted statistics may be complicated or degraded. This issue remains when a unit cell is constructed with two nominally identical serially connected pFETs.

Figure 10:
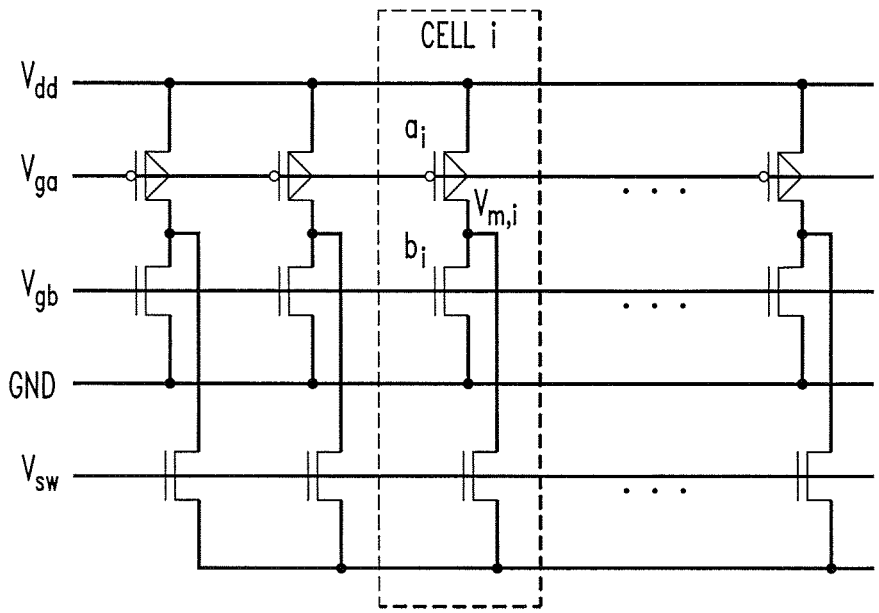
FIG. 10 is a circuit diagram illustrating a unit cell having an upper pFET and a lower NFET, according to an embodiment of the present invention.

Referring now to FIG. 10, a circuit diagram illustrates a unit cell having an upper pFET and a lower nFET, according to an embodiment of the present invention. In the structure topology of this embodiment of the present invention, upper pFET a and lower nFET b are serially connected. Since the pFET and NFET are symmetric, the source of the upper pFET is now Vdd. Therefore the gate-to-source voltage for upper pFET a is a constant, specifically, Vgb-Vdd, and is no longer a random variable as in FIG. 9. An exemplary implementation in which both devices in the sub-threshold regions may be realized is provided by setting Vdd=100 mV, Vgb=100 mV and Vga=0V (gnd). The gate-to-source voltage is 100 mV for the lower nFET and −100 mV for the upper pFET. Additionally, the connection of the mid-node Vm for different cells can be turned on and off by the control voltage Vsw.

The embodiment of the present invention described in relation to FIG. 10 provides an upper and a lower device that are different, and separation of the statistics between the nFET and pFET may be a more challenging task. On the other hand, with extensive Monte Carlo simulation and detailed analysis, the embodiment of the present invention described above in FIG. 10 may also assist in obtaining information on the correlation between nFET and pFET. Therefore, three different structures (2 nFET, 2 pFET, 1 pFET and 1 nFET) will complement each other in realization of a more complete picture of FET threshold operation.

Generally in the m×n array, and specifically in the 2×n array, each row may have elements of a different nature. For example, a 2×n array may have resistors as upper elements, while the lower elements are FETs. As another example, the elements in different rows of an m×n array may follow different statistical distributions.

Figure 11:
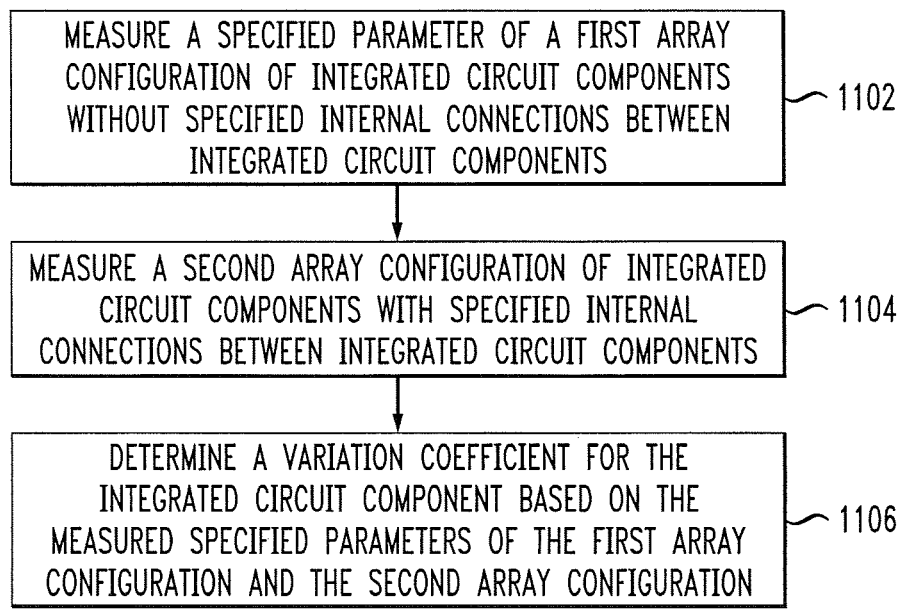
FIG. 11 is a flow diagram illustrating a variability measurement methodology of an integrated circuit component, according to an embodiment of the present invention.

Referring now to FIG. 11, a flow diagram illustrates a variability measurement methodology for an integrated circuit component, according to an embodiment of the present invention. The methodology begins in block 1102 in which a specified parameter of a first array configuration is measured. The first array configuration does not have specified internal connections between integrated circuit components. As described above, the integrated circuit component may include, for example, a conductor, a transistor, a capacitor or an inductor. Further, as described above, with regard to FIGS. 1-3, there are no horizontal internal connections between the integrated circuit components of the array. Finally, the specified parameter that is measured, may be a DC current that is run through the array in a preferred embodiment with a constant voltage applied to it. Alternatively, it may also be a voltage measurement with the constant current applied through the array.

In block 1104, the specified parameter of a second array configuration is measured. The second array configuration is identical to the first array configuration, with the exception of the specified internal connections between integrated circuit components of the array. In block 1106, a variation coefficient for the integrated circuit component is determined based on the measured specified parameters of the first array configuration and the second array configuration, terminating the variability measurement methodology. After determining the variation coefficient, a chip may be redesigned if it does not meet specified design requirements.

Measurement of the spread in the value of small capacitive elements used in integrated circuits would be difficult using the array approach described here with standard measurement techniques. This is especially true if the elements are leaky, such as, for example, the gate capacitance of small FETs. Ring oscillators may be used to accurately make high frequency capacitance measurements on small capacitive structures in the presence of high leakage. This technique can be adapted for use with the variation measurement technique described above.

Figure 12:
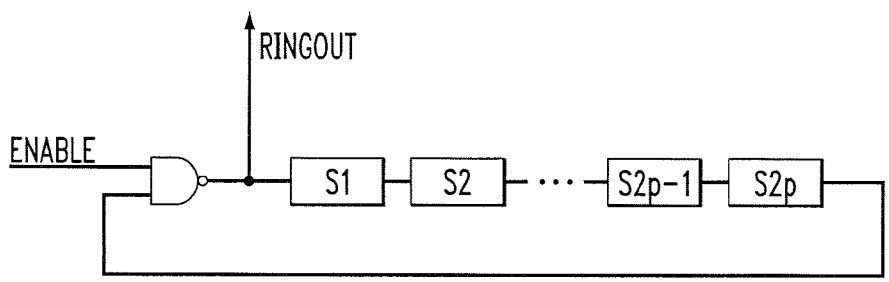
FIG. 12 is a circuit diagram illustrating a ring oscillator, according to an embodiment of the present invention.

Referring now to FIG. 12, a circuit diagram illustrates a ring oscillator, according to an embodiment of the present invention. The ring oscillator consists of 2p stages plus a nand2 used to enable the oscillations in the ring. The ring typically has a hundred or more stages and an oscillation frequency Fr in the GHz range. The output signal (RINGOUT) passes through an on-chip frequency divider to reduce the frequency by a factor of q to the MHz range where it can be measured with a low-cost commercial frequency counter.

For large p the delay per stage of the ring, D, is given by $$D=1/(4pqFr) \quad [7]$$

The capacitance per stage, Cs is computed as:

$$Cs=2D(IDDA-IDDQ)/Vdd \quad [8]$$

where IDDQ is the off current of the ring and IDDA is the active current of the ring. The value of the capacitive load CL is obtained by taking the difference in capacitances of the reference ring oscillator circuit and an additional ring oscillator circuit, $$CL=Cs2-Cs1 \quad [9]$$

This difference technique eliminates the inverter and other parasitic capacitances.

With regard to the embodiments of the present invention, three 2p stage rings are required: a reference ring with each stage consisting of a standard reference inverter; a second ring in which each stage consists of a standard reference inverter loaded with a capacitive load made up of a non-cross connected array of capacitors; a third ring in which each stage consists of a standard reference inverter loaded with a capacitive load made up of a similar cross connected array of capacitors. From the measured values of the ring frequencies, IDDA's and IDDQ's the values of the capacitance per stage of the two array types can be derived and the techniques previously discussed in this document then used to calculate variance in the capacitance of the elements making up the array. If all the inverters in the rings are identical, the signal to noise ratio for this determination will improve with the square root of 2p. There may also be overall area advantage with the ring oscillator approach over what can be obtained with single m×n arrays. In practice there will be some small additional variation associated with the reference inverter that must be taken into account.

Figure 13:
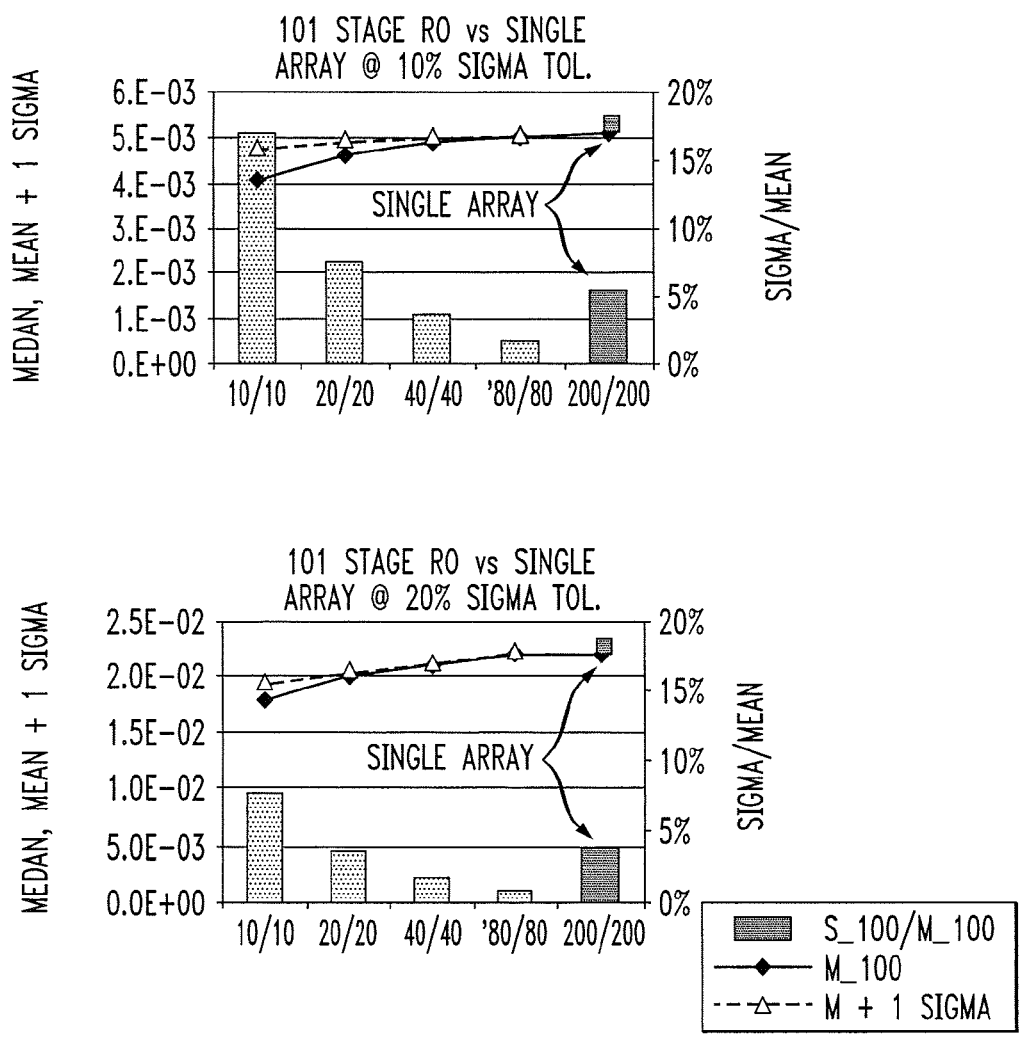
FIG. 13 is a set of graphs illustrating signal to noise and mean values for a stand alone array and a ring oscillator with load arrays of various size, according to an embodiment of the present invention.

Referring now to FIG. 13, a set of graphs illustrates signal to noise and mean values for a stand alone array and a ring oscillator with load arrays of various size, according to an embodiment of the present invention. This shows how the signal to noise ratio (1σ/mean) and the mean value of a 101 stage ring oscillator configuration compares to a stand alone array of 200×200 elements for two distributions of the single elements. It also shows how the mean plus 1σ of the signal trends with array size.

Figure 14:
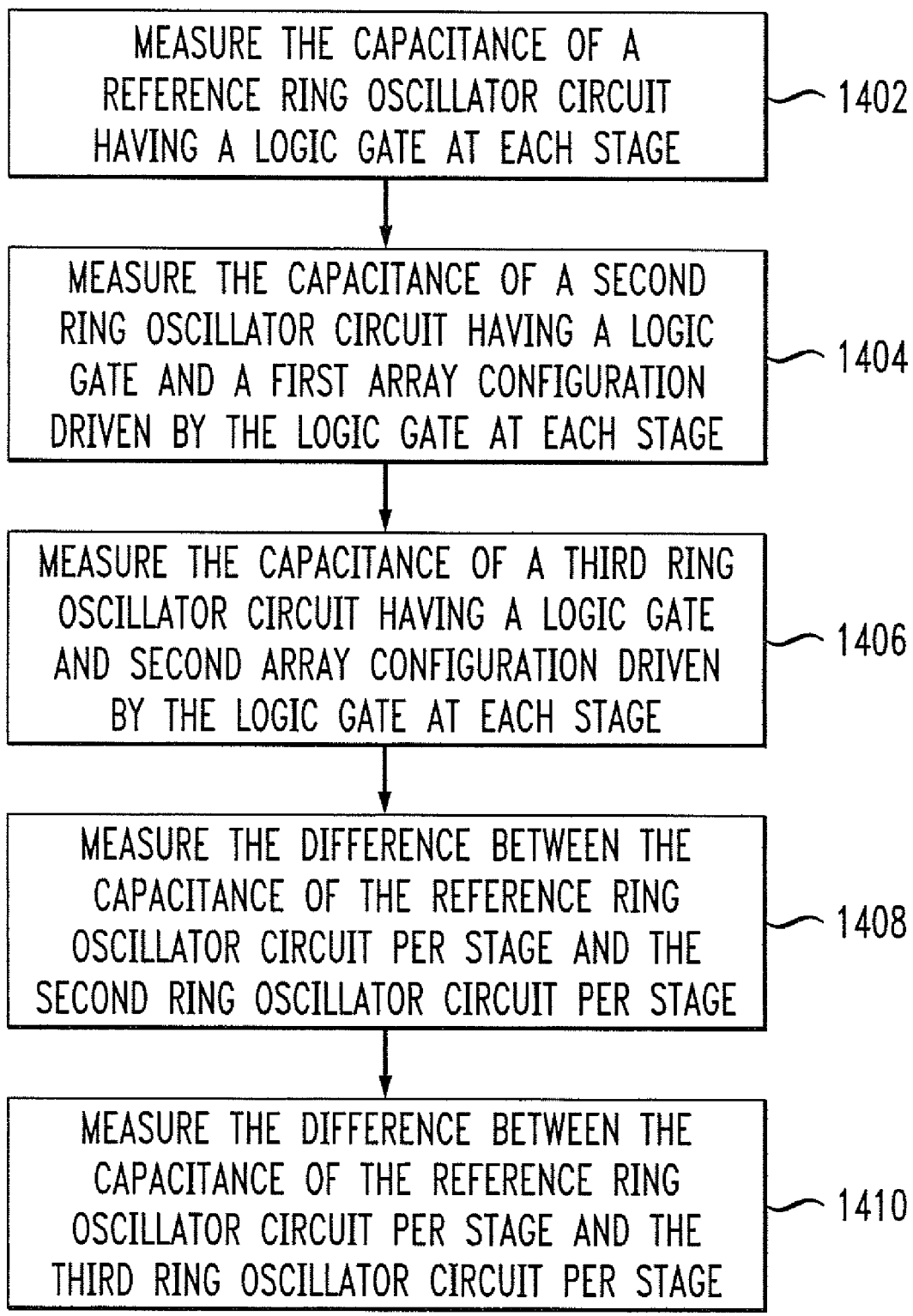
FIG. 14 is a flow diagram illustrating a specified parameter measurement methodology from an array configuration, according to an embodiment of the present invention.

Referring now to FIG. 14, a flow diagram illustrates a specified parameter measurement methodology from an array configuration, according to an embodiment of the present invention. This may be considered a detailed description of blocks 1102 and 1104 in FIG. 11. The methodology begins in block 1402 in which the capacitance of a reference ring oscillator circuit having a plurality of stages is measured. Each stage of the reference ring oscillator comprises a logic gate. In block 1404, a capacitance of a second ring oscillator circuit having a plurality of stages is measured. Each stage of the second ring oscillator comprises a logic gate substantially identical to the logic gates of the reference ring oscillator circuit as well as a first array configuration driven by the logic gate. In block 1406, a capacitance of third ring oscillator circuit having a plurality of stages is measured. Each stage of the third ring oscillator circuit has a logic gate substantially identical to the logic gates of the reference ring oscillator circuit and a second array configuration driven by the logic gate.

In block 1408, the difference between the measured capacitance of the reference ring oscillator circuit per stage and the second ring oscillator circuit per stage is calculated to determine a gate capacitance of the first array configuration load. In block 1410, the difference between the measured capacitance of the reference ring oscillator circuit per stage and the third ring oscillator circuit per stage is calculated to determine a gate capacitance of the third ring oscillator load, terminating the methodology.

A test structure implemented in accordance with the embodiments of the present invention will provide representative variation parameters for a structure area, typically considered local variation. However, the embodiments of the present invention not only provide local variations, but also local averages per macro. By examining the averages from many macros, chip to chip, or wafer to wafer, the global variation component may be obtained in addition to the local variations.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An integrated circuit device, comprising:
   at least one first array configuration of integrated circuit components comprising a m×n array of FETs, without specified internal connections between the integrated circuit components, wherein m is greater than two; and
   at least one second array configuration of integrated circuit components comprising an array of integrated circuit components nominally identical to those of the at least one first array configuration, with specified internal connections between integrated circuit components;
   wherein a variation coefficient is determined for the integrated circuit components based on a measured specified parameter of the at least one first array configuration and the at least one second array configuration.

2. The integrated circuit device of claim 1, wherein the at least one first array configuration comprises a switch-operated array with open switches at the specified internal connections and the at least one second array configuration comprises the switch-operated array with closed switches at the specified internal connections.

3. The integrated circuit device of claim 2, wherein switches of the switch-operated array are disposed horizontally between each integrated circuit component and a common wire.

4. The integrated circuit device of claim 2, wherein switches of the switch-operated array are disposed horizontally between every two neighboring integrated circuit components.

5. The integrated circuit device of claim 1, wherein the at least one first array configuration comprises a first fixed array and the at least one second array configuration comprises a second fixed array.

6. The integrated circuit device of claim 1, wherein the at least one first array configuration and the at least one second array configuration each comprise a rectangular lattice.

7. An integrated circuit device comprising:
   at least one first array configuration comprising two or more unit cells connected in parallel, wherein each unit cell comprises at least one nFET and at least one pFET without specified inter-array connections between the two or more unit cells; and
   at least one second array configuration comprising two or more unit cells connected in parallel, wherein each unit cell comprises at least one nFET and at least one pFET with specified inter-array connections between the two or more unit cells;
   wherein a variation coefficient is determined for an integrated circuit components based on a measured specified parameter of the at least one first array configuration and the at least one second array configuration.

8. The integrated circuit device of claim 7, wherein the at least one nFET and the at least one pFET are serially connected and the gate-to-source voltage for an nFET and a pFET is constant.

\* \* \* \* \*